United States Patent [19]
Darmawan

[11] Patent Number: 5,681,765
[45] Date of Patent: Oct. 28, 1997

[54] PROCESS FOR FABRICATING SINGLE POLYSILICON HIGH PERFORMANCE BICMOS

[75] Inventor: Johan Darmawan, Cupertino, Calif.

[73] Assignee: National Semiconductor Corporation, Santa Clara, Calif.

[21] Appl. No.: 738,569

[22] Filed: Oct. 28, 1996

[51] Int. Cl.$^6$ .................................................. H01L 21/265
[52] U.S. Cl. ............................ 437/31; 437/59; 437/191; 148/DIG. 9
[58] Field of Search .................... 437/31, 59, 191; 148/DIG. 9

[56] References Cited

U.S. PATENT DOCUMENTS

| | | | |
|---|---|---|---|
| 5,112,761 | 5/1992 | Matthews | 437/31 |
| 5,132,234 | 7/1992 | Kim et al. | 148/DIG. 9 |
| 5,171,702 | 12/1992 | Prengle et al. | 148/DIG. 9 |
| 5,182,225 | 1/1993 | Matthews | 437/58 |
| 5,196,356 | 3/1993 | Won et al. | 148/DIG. 9 |
| 5,338,696 | 8/1994 | Ilderem et al. | 437/34 |
| 5,354,699 | 10/1994 | Ikeda et al. | 148/DIG. 9 |
| 5,512,497 | 4/1996 | Ikeda et al. | 437/34 |

*Primary Examiner*—John Niebling
*Assistant Examiner*—Long Pham
*Attorney, Agent, or Firm*—Skjerven, Morrill, MacPherson, Franklin & Friel; Edward C. Kwok

[57] ABSTRACT

The present method for forming a BICMOS device includes the steps of defining first and second active regions for formation of bipolar and MOS transistors respectively. A gate oxide is provided over the second active region, and a polysilicon layer portion is provided over the gate oxide. A second, relatively thick polysilicon layer is provided over the resulting structure so as to overlie the first and second active regions, gate oxide and polysilicon layer portion. A portion of the thick polysilicon layer overlying the first active region is masked, and the unmasked portion of the thick polysilicon layer is etched to thin it. After removal of the masking, the processing steps to complete the bipolar transistor and MOS transistor are undertaken, the thinning of the unmasked portion of the thick polysilicon layer having been undertaken so that as appropriate etching in further processing takes place, gouging of the first active region during such further etching is avoided.

5 Claims, 6 Drawing Sheets

PROCESS FOR FABRICATING SINGLE POLYSILICON HIGH PERFORMANCE BICMOS

FIELD OF THE INVENTION

This invention relates to semiconductor devices, and more particularly, to a process for fabricating a BICMOS device.

BACKGROUND OF THE INVENTION

U.S. Pat. No. 5,338,696, assigned to the assignee of this invention, discloses a process for fabricating a BICMOS device, i.e., a device which includes MOS transistors in a complimentary relationship, and also bipolar transistors. Such a device, in single polysilicon layer form, has definite known advantages such as lower extrinsic base resistance. However, in the interest of improving process efficiency and device performance, the present invention is set forth.

With regard to the prior art FIGS. 1 through 7, it has been noted that under certain circumstances a processing problem can arise, which can lead to device performance degradation.

In FIG. 1, the semiconductor device thus indicated includes an epitaxial layer 20 having field oxide regions 22, 24, 26 formed therein, and tubs 28, 30 of chosen conductivity type formed in the active regions 32, 34 of the device for eventual formation of bipolar and MOS transistors. For example, the tub 28 will eventually have formed in it a bipolar transistor, while the tub 30 will eventually have formed in it a transistor of a CMOS pair, for example, an NMOS transistor. Formed over the resulting structure is a thin oxide layer 36 which will eventually be used to define the gate oxide of the MOS transistor, and a thin polysilicon layer 38, all as is well known. The polysilicon layer 38 is included to protect the oxide layer 36 from direct contact with photoresist, without which protection gate oxide integrity would suffer.

At this point, in order to form the gate oxide of the eventual NMOS transistor to the correct configuration, a photoresist mask 40 is provided and patterned over the polysilicon layer 38, as shown in FIG. 1.

Next (FIG. 2), an etching process is undertaken to etch away the portions of the thin polysilicon layer 38 and oxide layer 36 which are not protected by the photoresist 40, so that gate oxide 36A and thin polysilicon layer portion 38A are formed. This etching is done sufficiently to clear the active regions 32, 34 between the field oxide regions 22, 24 and 24, 26.

Next, with reference to FIG. 3, a thick layer of polysilicon 40 is deposited over the resulting structure. This polysilicon layer 40 is masked by photoresist 42, and an ion implantation 44 is undertake to form the base-emitter region 46 of the eventual bipolar transistor in the tub 28.

As indicated in FIG. 4, the photoresist 42 is then removed, and another layer of photoresist 48 is provided and patterned over the thick polysilicon layer 40, the photoresist 48 pattern being chosen so that the polysilicon portion of the gate of the MOS eventually formed transistor and the emitter of the eventually formed bipolar transistor will be defined through etching.

FIG. 5 is an enlarged view of a portion of the semiconductor device of FIG. 4, showing the detailed configuration of the field oxide region 24 adjacent the active region 34. As shown therein, the top of the oxide region 24 is not flat, but rather, the well known birds-beak 24A is formed, so that a hump 24B is defined on the surface of the oxide region 24.

This results in the polysilicon layer 40 having different thicknesses as measured vertically, indicated at $X_1$, $X_2$ in FIG. 5. In addition (FIG. 4), the vertically measured thickness of polysilicon over the gate oxide 36A (including the thickness of both polysilicon layer 40 and polysilicon layer portion 38A) is greater than the vertically measured thickness of polysilicon over the active region 32 (including only the thickness of polysilicon layer 40).

Furthermore, an interfacial oxide generally has been formed on the device, and because it is so uncontrolled, it can vary widely from one wafer to the next.

With reference to FIG. 6, after appropriate application and patterning of photoresist 43, in order to etch the polysilicon layer 40 and polysilicon layer portion 38A to form the polysilicon gate 41, to clear the polysilicon from the field oxide regions (for example region 24, FIG. 5) and from the active regions 32, 34, to clear the interfacial oxide, and to form the emitter of the eventual bipolar transistor, etched undercuts 50, 52 may occur as shown in FIG. 6 in the area of the active region 32. The resulting device after removal of photoresist is shown in FIG. 7.

The overetch as described above can result in serious device problems in the eventually formed bipolar transistor said as leakage and breakdown.

SUMMARY OF THE INVENTION

The present invention overcomes the above-cited problems by providing a mechanism for avoiding overetch of the bipolar transistor active region during formation of the gate of the MOS transistor and the emitter of the bipolar transistor. This is achieved by, subsequent to providing the thick polysilicon layer, masking off part of the thick polysilicon layer and etching the exposed thick polysilicon layer to thin it to an extent so that upon removal of the mask, further etching of the thick polysilicon layer clears the active regions as appropriate but does not gouge or etch into the epitaxial layer in the active region of the bipolar transistor.

DESCRIPTION OF THE PREFERRED EMBODIMENT

Figure 1:
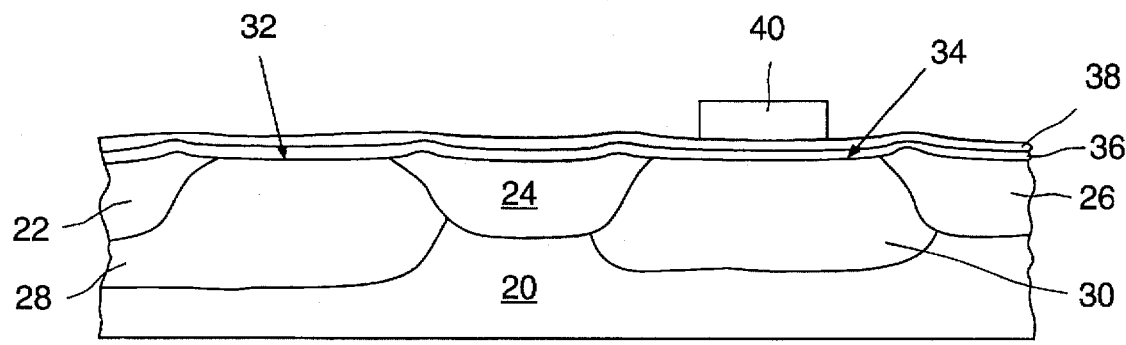
FIGS. 1 through 7 show a prior art process for forming a BICMOS device.
Figure 8:
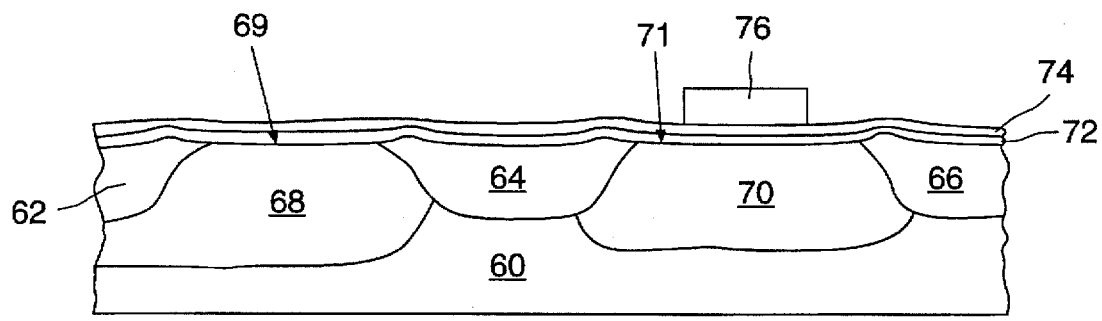
FIGS. 8 through 17 show the present process for forming a BICMOS device.

With reference to FIG. 8, similar to FIG. 1, shown therein is a semiconductor device including an epitaxial layer 60 having field oxide regions 62, 64, 66 formed therein, a tub 68 of chosen conductivity type in active region 69 for formation of a bipolar transistor, and a tub 70 of chosen conductivity type in active region 71 for formation of an MOS transistor of a CMOS pair. The device has a thin oxide layer 72 over the resulting structure which will eventually define the gate oxide of the to-be-formed MOS transistor, and a thin polysilicon layer 74 (for example 500 Å thick) over the thin oxide layer 72. In addition, a photoresist mask 76 is formed, all as previously described.

Figure 2:
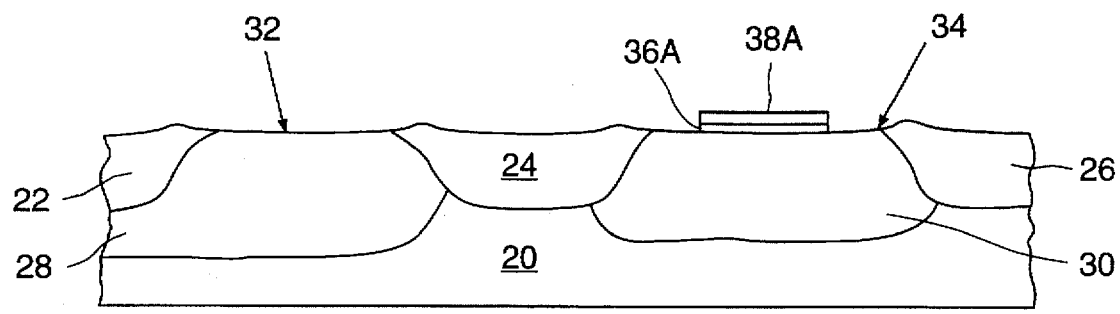
Figure 3:
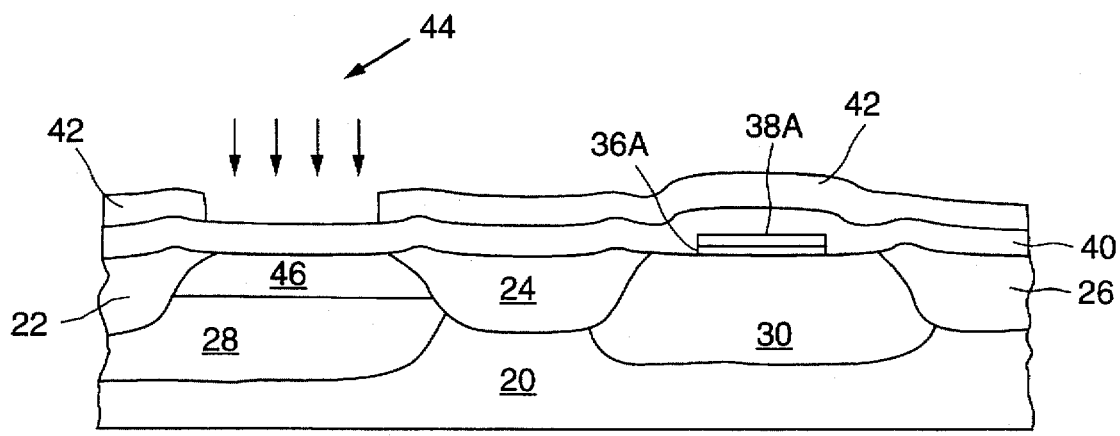
Figure 4:
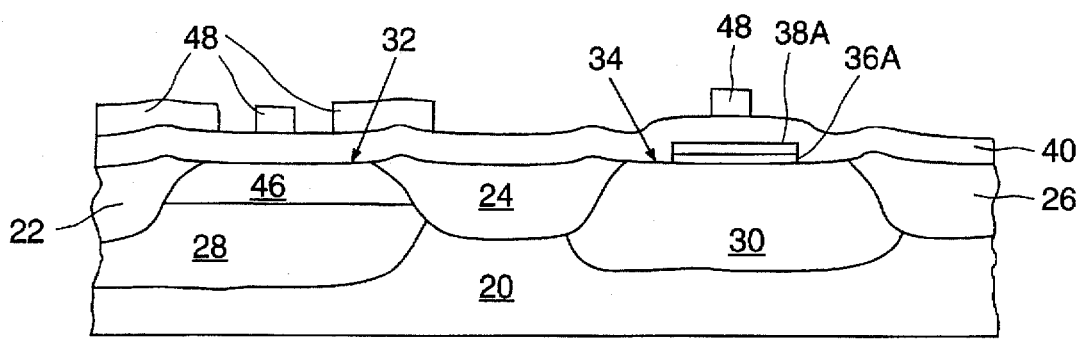
Figure 9:
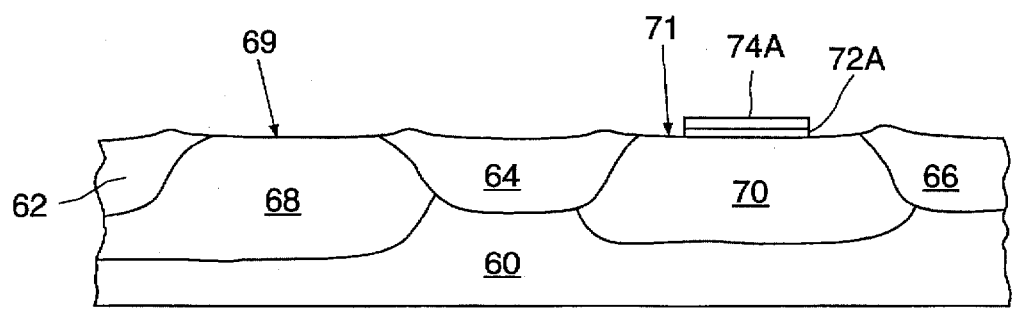
Figure 10:
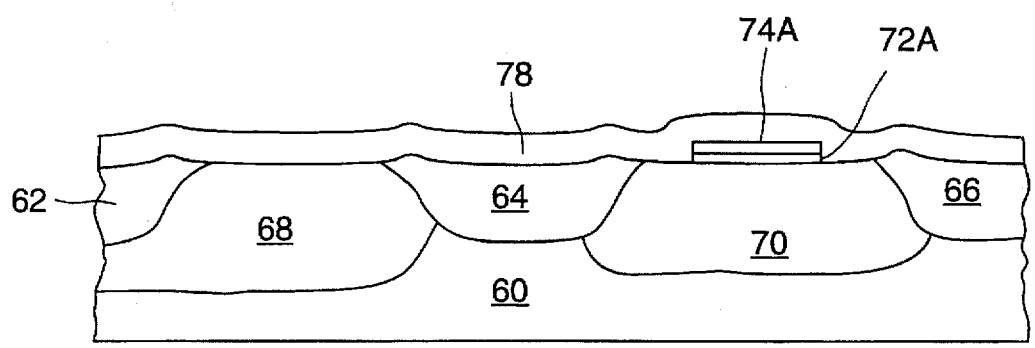
Figure 11:
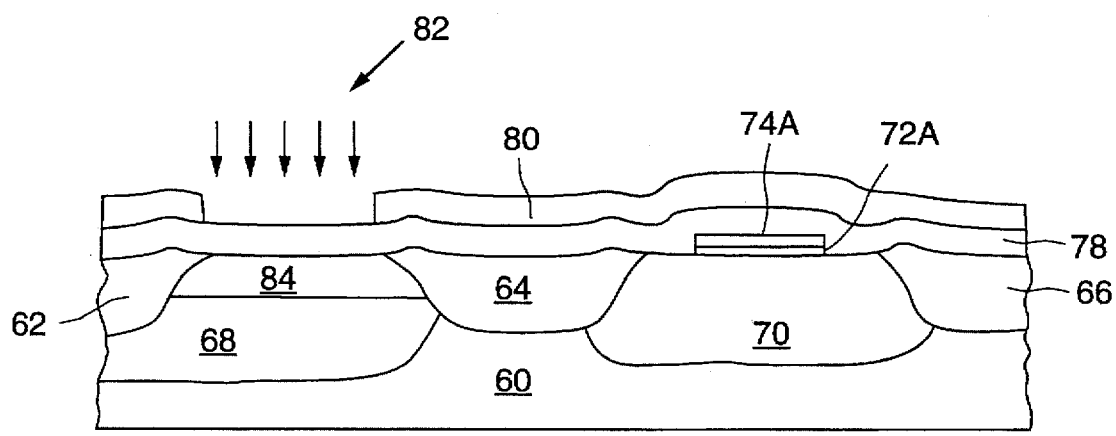

Then, similar to FIG. 2, etching is undertaken (FIG. 9) to define the gate oxide 72A, resulting in a thin layer portion 74A of polysilicon remaining over the gate oxide 72A, and the photoresist mask 76 is removed. Next, a thick layer of polysilicon 78 (for example 3250 Å thick) is deposited over the resulting structure FIG. 10), such thick polysilicon layer 78 is masked with photoresist 80 (FIG. 11), and an ion implantation 82 is undertaken to form the base-emitter region 84 of the eventual bipolar transistor in the tub 68.

Figure 12:
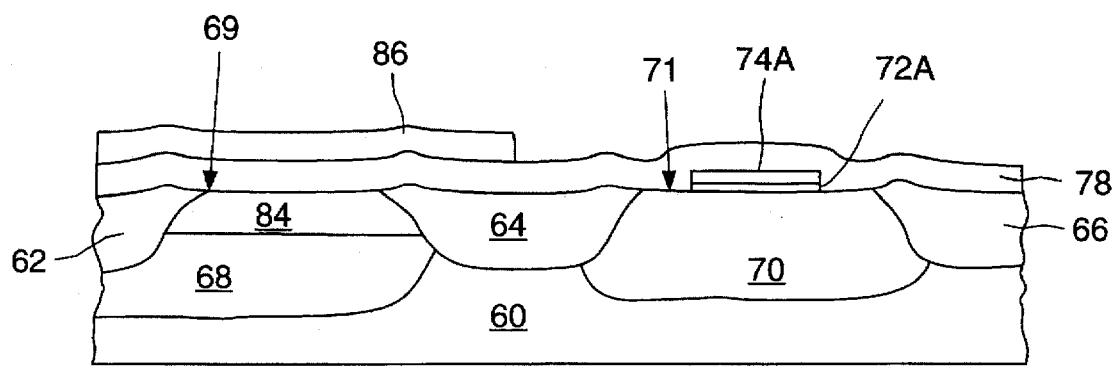
Figure 13:
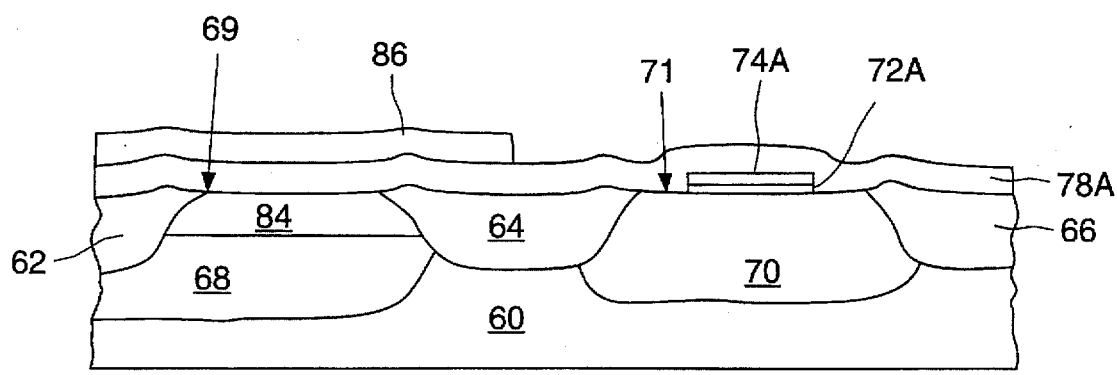

With reference to FIG. 12, a photoresist layer 86 is provided over the thick polysilicon layer 78 and is patterned to cover the portion of the thick polysilicon layer 78 over the active region 69 of the eventual bipolar transistor, while leaving exposed the portion of the thick polysilicon layer 78 over the active region 71 of the eventual MOS transistor. Next, an etch of the exposed portion of the polysilicon layer 78 is undertaken to remove a small part of the overall thickness thereof, as shown in FIG. 13. The resulting polysilicon layer 78A has a configuration as shown in FIGS. 13 and 14.

Figure 14:
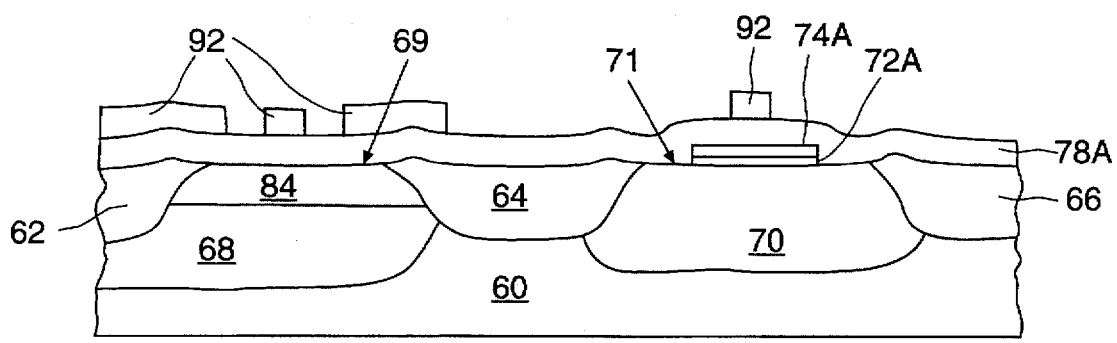

Next, this resulting polysilicon layer 78A is masked with photoresist 92 patterned as shown in FIG. 14, and the polysilicon layer 78A is then etched. This results in the structure of FIG. 15.

Figure 5:
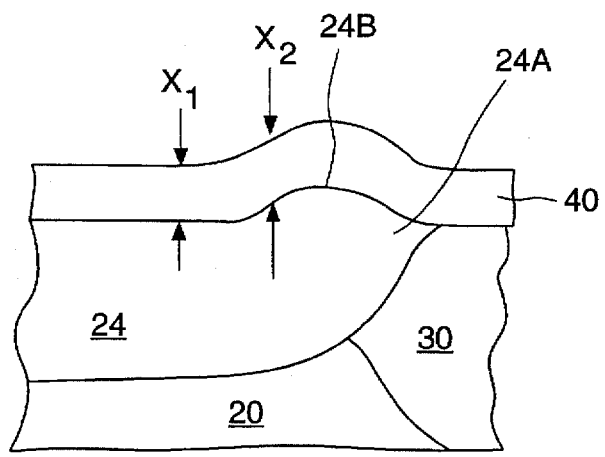
Figure 6:
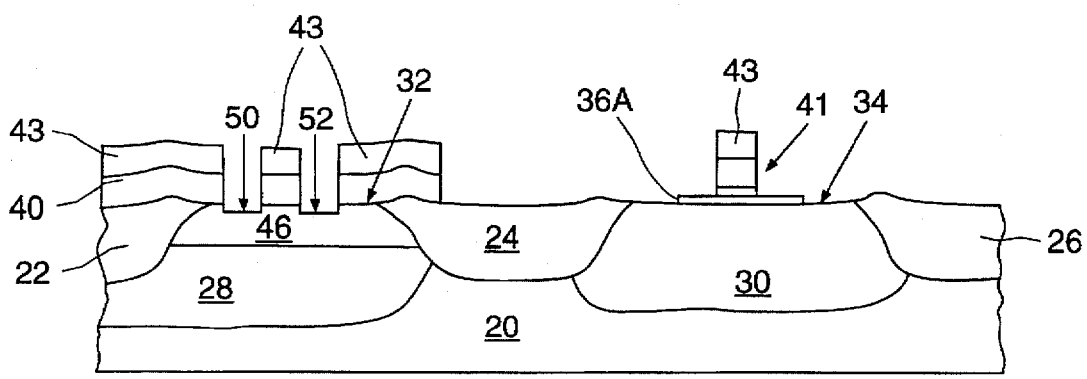
Figure 7:
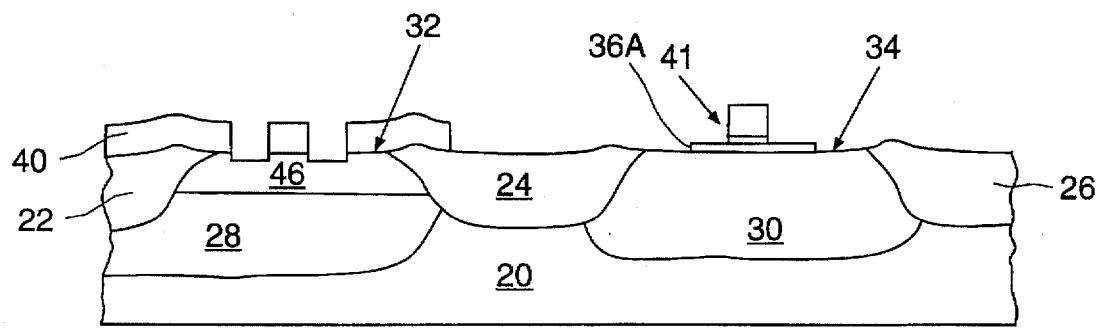
Figure 15:
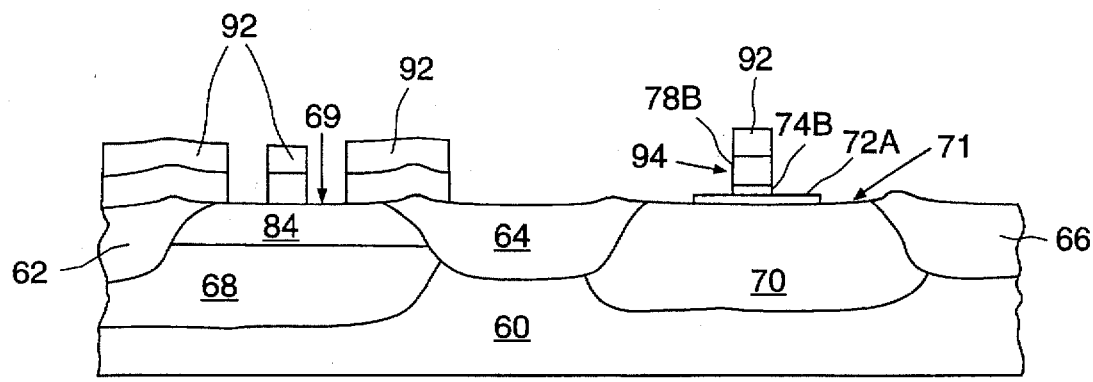

It will be noted that with the polysilicon layer 78A being configured as indicated (FIGS. 13 and 14), the etchant (FIG. 15) will not only etch through the reduced-thickness portion of the polysilicon layer 78A, but also through the end portions of the thin polysilicon layer portion 74A which are not under photoresist 92. The remaining polysilicon layer portion 74B and thick polysilicon layer 78B form the gate 94 o to-be-formed MOS transistor (FIG. 15). Meanwhile, because the thickness of the polysilicon layer 78A is greater over the active region 69 than over the active region 71, the etching of the polysilicon layer 78A over the active region 69 will take place through the interfacial oxide and only down to the surface of the active region 69. Meanwhile, a small overetch into the active region 71 is not a problem. Since in MOS, the gate poly etch is selective to gate oxide resulting in no overetch around the gate except the source/drain which serves as source/drain electrical contact, therefore, no degradation occurs. Also, the etching in the area of the birds-beak of oxide region 64 is compensated for since the area involved has already been thinned in the polysilicon layer area. Thus the problems outlined with reference to FIG. 5 above are overcome.

Figure 16:
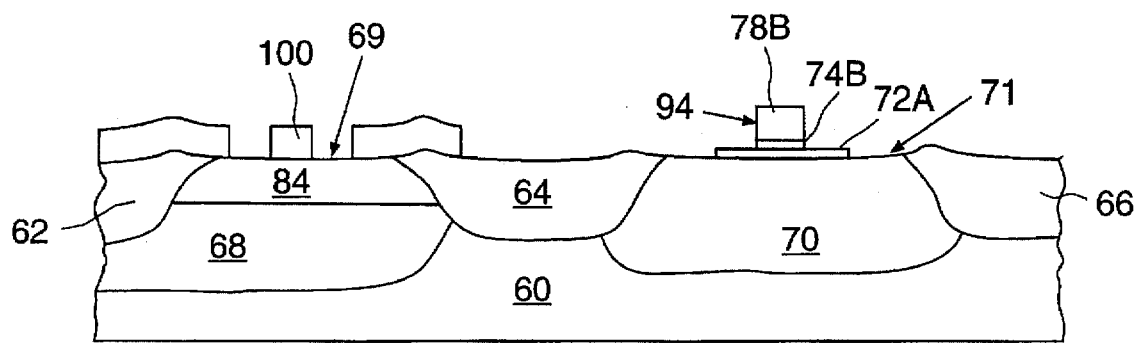
Figure 17:
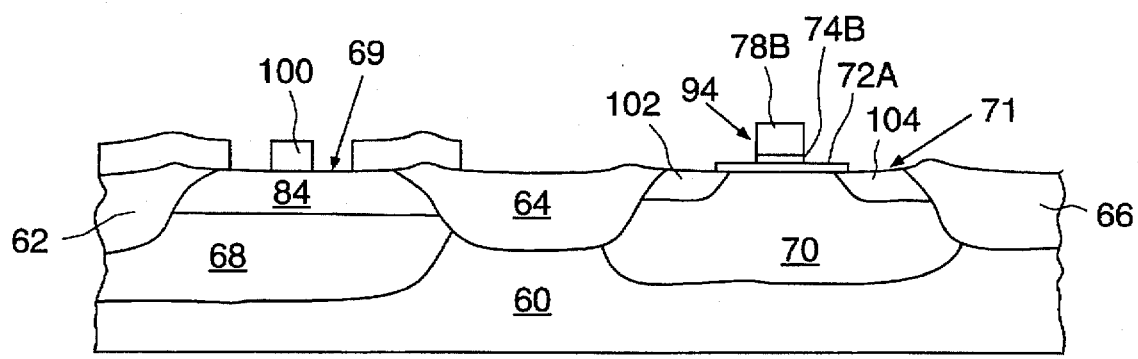

After removal of the masking, it will be seen that the emitter 100 (FIGS. 16 and 17) of the bipolar transistor has been appropriately formed, and also the gate 94 and gate oxide 72A of the MOS transistor have been appropriately formed. For completion of the device, the source 102 and drain 104 of the MOS transistor can be completed, as is well known (FIG. 17).

By practicing the above method, the problems of the prior art are overcome.

What is claimed is:

1. A method of fabricating a semiconductor device comprising:

providing a semiconductor body having a first region for formation of a bipolar device and a second region for formation of an MOS device;

providing an oxide layer over a portion of the second region;

providing a first polysilicon layer over the oxide layer;

providing a second polysilicon layer over the resulting structure, so as to overlie the first and second regions, oxide layer and first polysilicon layer;

masking a portion of the second polysilicon layer overlying the first region; and etching an unmasked portion of the second polysilicon layer overlying the second region.

2. The method of claim 1 and further comprising the step of providing that the second polysilicon layer provided over the resulting structure is in contact with the first region.

3. The method of claim 1 wherein the step of etching an unmasked portion of the second polysilicon layer comprises etching away less than the full thickness of the second polysilicon layer.

4. The method of claim 1 and further comprising the step of, subsequent to said etching, exposing the remaining second polysilicon layer, masking portions of the remaining second polysilicon layer, and etching the exposed portions of the remaining polysilicon layer.

5. The method of claim 4 and further comprising the step of providing that the etching of exposed portions of the remaining polysilicon layer comprises forming a portion of a gate of an MOS transistor, and an emitter of a bipolar transistor.

* * * * *